United States Patent
Kim

(10) Patent No.: US 10,734,050 B2
(45) Date of Patent: Aug. 4, 2020

(54) APPARATUSES AND METHODS FOR PROVIDING WORD LINE VOLTAGES

(71) Applicant: MICRON TECHNOLOGY, INC., Boise, ID (US)

(72) Inventor: Tae H. Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/405,075

(22) Filed: May 7, 2019

(65) Prior Publication Data

US 2019/0259434 A1 Aug. 22, 2019

Related U.S. Application Data

(63) Continuation of application No. 15/495,401, filed on Apr. 24, 2017, now Pat. No. 10,311,927.

(51) Int. Cl.
*G11C 8/08* (2006.01)
*G11C 8/10* (2006.01)
*G11C 8/14* (2006.01)

(52) U.S. Cl.
CPC ............... *G11C 8/10* (2013.01); *G11C 8/08* (2013.01); *G11C 8/14* (2013.01)

(58) Field of Classification Search
CPC .... G11C 7/12; G11C 8/08; G11C 8/10; G11C 11/4085
See application file for complete search history.

(56) References Cited

U.S. PATENT DOCUMENTS

| | | | | |
|---|---|---|---|---|
| 4,507,574 A | * | 3/1985 | Seki | G11C 8/08 326/108 |
| 5,602,796 A | * | 2/1997 | Sugio | G11C 8/08 365/230.06 |
| 6,469,952 B1 | | 10/2002 | Tsukikawa et al. | |
| 6,628,564 B1 | | 9/2003 | Takita et al. | |
| 7,839,714 B2 | | 11/2010 | Sugawara | |
| 7,876,612 B2 | | 1/2011 | Parent | |
| 8,743,628 B2 | * | 6/2014 | Kim | G11C 11/4085 365/185.23 |
| 2004/0042321 A1 | * | 3/2004 | Kirsch | G11C 8/08 365/230.06 |
| 2004/0252573 A1 | | 12/2004 | Hanson et al. | |

(Continued)

*Primary Examiner* — Khamdan N. Alrobaie
(74) *Attorney, Agent, or Firm* — Dorsey & Whitney LLP

(57) ABSTRACT

Methods and apparatuses of providing word line voltages are disclosed. An example method includes: activating and deactivating a word line. Activating the word line includes: rendering the first, second and third transistors conductive, non-conductive and non-conductive, respectively, wherein the first transistor is rendered conductive by supplying a gate of the first transistor with a first voltage; and supplying the first node with an active voltage. Deactivating the word line includes: changing a voltage of the first node from the active voltage to an inactive voltage; changing a voltage of the gate of the first transistor from the first voltage to a second voltage, wherein the first transistor is kept conductive by the second voltage; rendering the third transistor conductive during the gate of the first transistor being at the second voltage; and rendering the first and second transistors non-conductive and conductive, respectively, after the third transistor has been rendered conductive.

20 Claims, 7 Drawing Sheets

(56) References Cited

U.S. PATENT DOCUMENTS

2006/0120176 A1 6/2006 Schneider et al.
2008/0031060 A1 2/2008 Choi et al.
2008/0137466 A1 6/2008 Nakamura
2013/0039132 A1 2/2013 Kim et al.
2014/0347951 A1 11/2014 Kim
2018/0308530 A1 10/2018 Kim

* cited by examiner

APPARATUSES AND METHODS FOR PROVIDING WORD LINE VOLTAGES

CROSS REFERENCE TO RELATED APPLICATION(S)

This application is a continuation of U.S. patent application Ser. No. 15/495,401 filed Apr. 24, 2017 and issued as U.S. Pat. No. 10,311,927 on Jun. 4, 2019. The aforementioned application, and issued patent, is incorporated herein by reference, in its entirety, for any purpose.

BACKGROUND

Memories typically include an array of memory cells arranged in rows and columns. Memory cells of each row are accessed by activating a corresponding access line often referred to as a word line. The word line may be activated by a word line driver responsive to decoding a corresponding row address with a row address decoder.

Word line drivers typically comprise a p-channel field effect transistor (pFET) and an n-channel field effect transistor (nFET) coupled together at their respective drains and gates, forming a complementary FET output stage coupled to the word line at the drains of the transistors. The source of the pFET can be configured to receive, for example, a phase signal (e.g., from a phase decoder). Meanwhile, the source of the nFET can be configured to receive, for example, a deactivated word line voltage (e.g., VNEGWL). Assuming a sufficiently high voltage phase signal (e.g., VCCP, which may be a pumped supply voltage) is provided as the phase signal to the source of its word line driver, a word line may be activated by providing a sufficiently low voltage (e.g., ground) to the gate of the pFET to turn on the pFET and pull the word line up to ~VCCP. To deactivate the word line to close the row), as is typically desired after a row of memory cells has been accessed (e.g., refreshed, read or written), a sufficiently high voltage (e.g., VCCP) is provided to the gate of the nFET to quickly turn on the nFET and pull the word line down to ~VNEGWL.

One of performance issues associated with the use of such a word line driver is a prolonged read-to-precharge time (tRP) from hot carrier degradation of nFET(s) in the word line driver due to aging stress. For each discharge of a word line, the source of the pFET may receive the phase signal PH in the inactive state and the GRF signal in the active state and the pFET and the nFET are configured to cause a signal level of the word line WL to transition to a logic low level. However, the signal level of the word line WL may not effectively transition to the logic low level responsive to the PH signal in the inactive state and the GRF signal in the inactive state within the tRP as designed, when the nFET has a higher drain-source voltage Vds, due to hot carrier degradation that keeps the signal level of the word line WL higher than the logic low level. In order to improve the word line driver's reliability by keeping the tRP short enough, maintaining a lower drain-source voltage Vds of the nFET and keeping a lower signal level (e.g., a negative voltage) of the word line WL may be desired when the signal level of the word line WL is supposed to transition from the logic high level to the logic low level (e.g., a falling edge of the word line WL).

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
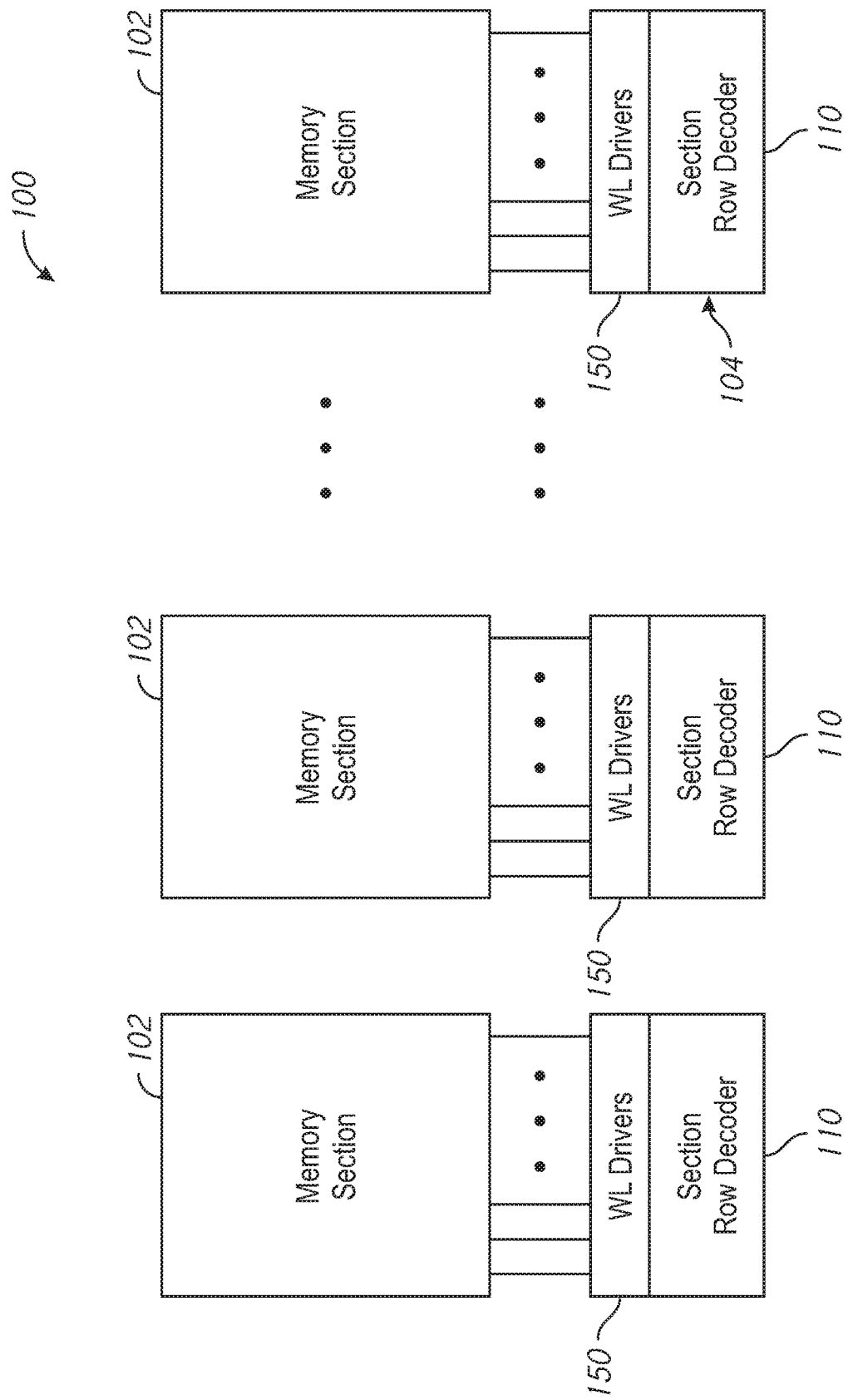
FIG. 1 is a block diagram of a memory device in accordance with an embodiment of the present disclosure.

FIG. 1 is a block diagram of a memory device 100 in accordance with an embodiment of the present disclosure. The memory device 100 may include a plurality of memory sections 102 that may include a plurality of rows of memory cells (not shown) that may be accessed by activating corresponding word lines (WLs). A respective section row decoder 110 and word line driver circuit 150 may be coupled to the WLs of the corresponding memory section 102. In operation, data may be stored in the memory sections 102, with the section row decoders 110 and the word line driver circuits 150 used during access. The memory device 100 may have a standby mode, during which the memory device enters an operating state where the memory sections 102 are not accessed to reduce power consumption. In contrast, during an active mode, the memory device is in an operating state where the memory sections 102 may be accessed, which results in greater power consumption.

Figure 2:
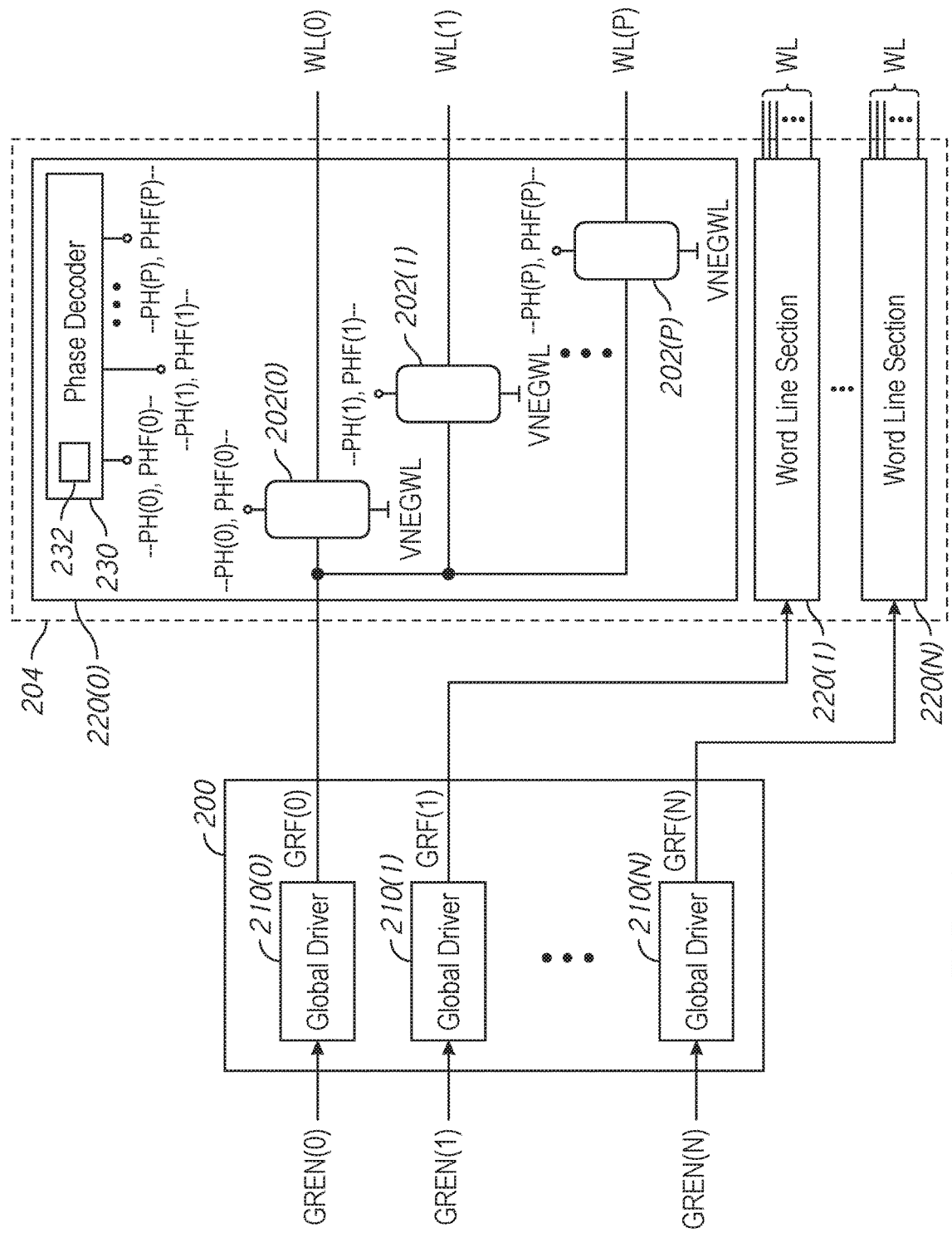
FIG. 2 is a block diagram of portions of a decoder and word line drivers in accordance with an embodiment of the present disclosure.

FIG. 2 is a block diagram of portions of a decoder 200 and word line drivers 204 in accordance with an embodiment of the present disclosure. The decoder 200 and the word line drivers 204 may be used for the section row decoders 110 and word line drivers 150 of FIG. 1. For example, the decoder 200 may include global drivers 210(0)-210(N) coupled to word line sections 220(0)-220(N) of the word line drivers 204 of a memory section. Each of the word line sections 220 includes word line drivers 202(0)-202(P), each of which may be coupled to a respective WL, and further includes a phase decoder 230 coupled to each of the word line drivers 202(0)-202(P) to provide a respective PH signal and a respective PHF signal. The PH and PHF signals may be indicative of enabling and disabling the respective word line. The phase decoder 230 includes signal drivers 232 configured to provide the PH and PHF signals. Each of the global word line drivers 210(0)-210(N) may provide word line drivers 202 of a respective word line section 220 with a respective global row signal GR(0)-GR(N). A respective global row enable signal GREN(0)-GREN(N) is provided to each of the global drivers 210(0)-210(N) of a memory section.

Each word line driver 202 may receive a GRF signal from the respective global driver 210. Each word line driver 202 may receive respective phase signals PH and PHF from the phase decoder 230, and a deactivated word line voltage VNEGWL, where a WL may be deactivated by coupling it to the VNEGWL voltage. Each word line driver 202 may be coupled to a respective word line WL and may provide a signal to the respective word line WL responsive to the respective phase signals PH and PHF and the GRF signal.

In operation, during a standby mode for the memory, inactive GREN signals are provided to the global drivers 210(0)-210(N)), thereby causing the GRF signals to be at the VCCP voltage. As a result, the word line drivers 202 may couple the WLs to the VNEGWL voltage. During an active mode for the memory, a word line section 220 may be made active so that memory in the memory section may be accessed. The GRF, PH and PHF signals are coordinated to drive selected word lines for accessing associated memory.

Figure 3:
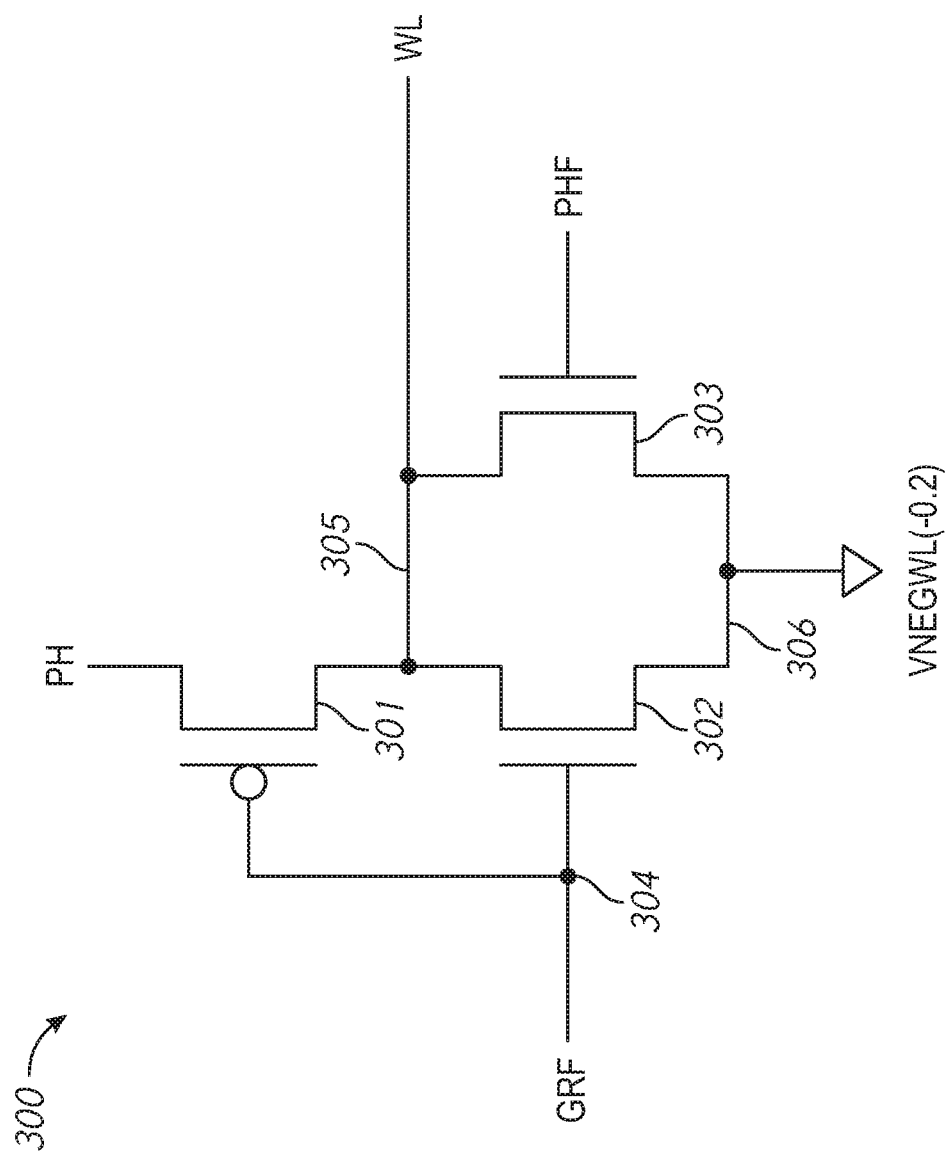
FIG. 3 is a schematic diagram of a word line driver in accordance with an embodiment of the present disclosure.

FIG. 3 is a schematic diagram of a word line driver 300 in accordance with an embodiment of the present disclosure. For example, the word line driver 300 may be used as the word line driver 220 in FIG. 2. The word line driver 300 may include a transistor 301 of a first type (e.g., p-channel) and a transistor 302 of a second type (e.g., n-channel). The transistors 301 and 302 may be coupled at their respective drains to form a node 305 that provides an output signal to a respective word line WL. Gates of the transistors 301 and 302 may receive the GRF signal on a node 304. A source of the transistor 301 may receive a respective phase signal PH from the phase decoder 230 in FIG. 2, and a source of the transistor 302 may receive a deactivated word line voltage VNEGWL at a node 306 where the word line WL may be deactivated by coupling it to the VNEGWL voltage. The word line driver 300 may further include a transistor 303. For example, the transistor 303 may be of the second type (e.g., n-channel). A drain of the transistor 303 may be coupled to the node 305 and a source of the transistor 303 may be coupled to the node 306. A gate of the transistor 303 may receive the PHF signal.

Figure 4A:
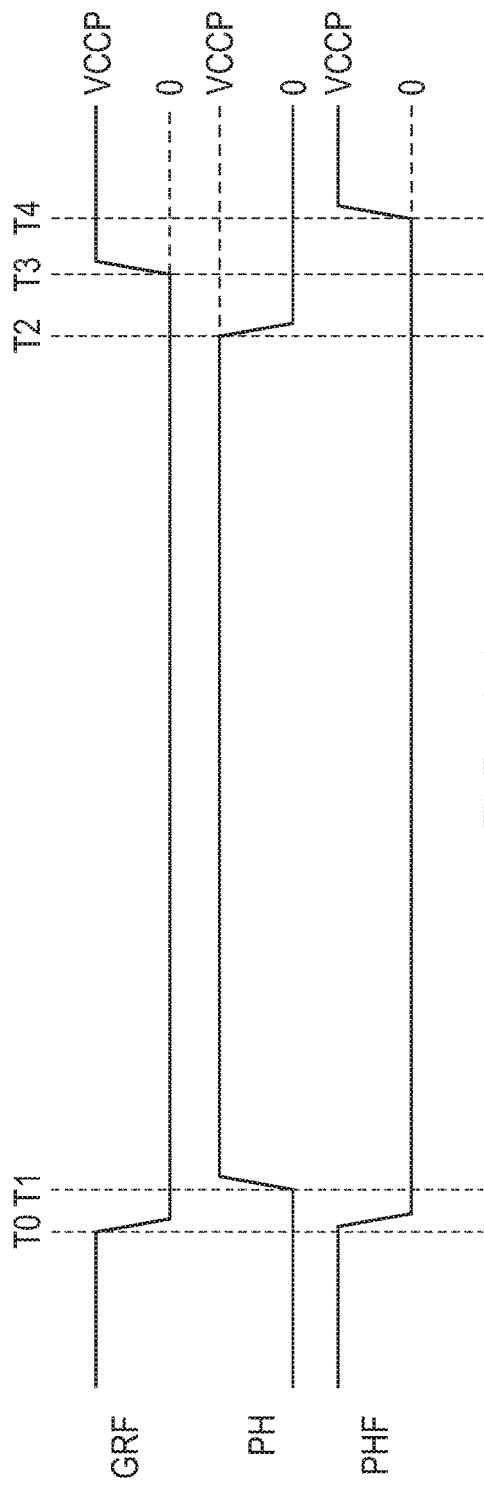
FIG. 4A is a timing diagram of input signals according to the prior art.

FIG. 4A is a timing diagram of input signals during operation of the word line driver of FIG. 3 in accordance with the prior art. At around a time T0, the GRF signal may be set to an active state (e.g., a logic low level) and the PHF signal may be set to an inactive state (e.g., a logic low level). At a time T1, slightly later than T0, the PH signal may be set to an active state (e.g., a logic high level at a voltage VCCP) to enable the word line WL. At a time T2, the PH signal may be set to an inactive state (e.g., a logic low level) to disable the word line WL. At a time T3, slightly later than T2, the GRF signal may be set to an inactive state (e.g., a logic high level at a voltage VCCP). At a time T4, slightly later than T3, the PHF signal may be set to an active state (e.g., a logic high level at a voltage VCCP).

Figure 5:
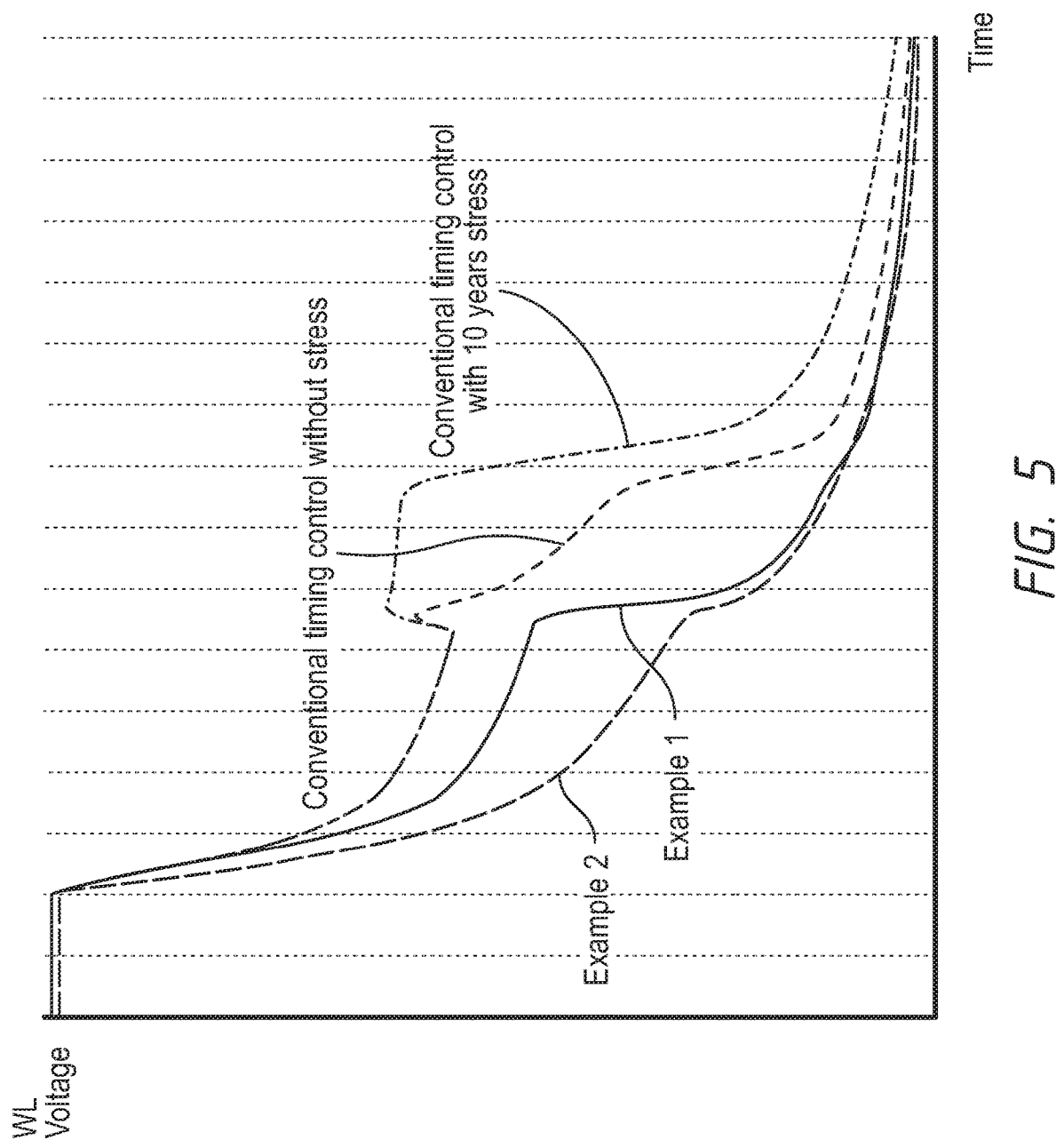
FIG. 5 is an example timing diagram of a word line voltage of a word line driver.

The transistor 302 of the second type may include a drain-source voltage Vds. A signal level of the word line WL may not transition to a logic low level merely receiving the PH signal in the inactive state at T3 and receiving the GRF signal in the inactive state at T4, due to this drain-source voltage Vds, which keeps a signal level of the word line WL higher than the logic low level. FIG. 5 is an example timing diagram of a word line voltage for a word line driver. The example timing diagram of FIG. 5 generally illustrates that the transition of the word line WL to the inactive state may be delayed due to the change in the drain-source voltage Vds after years of stress.

Figure 4B:
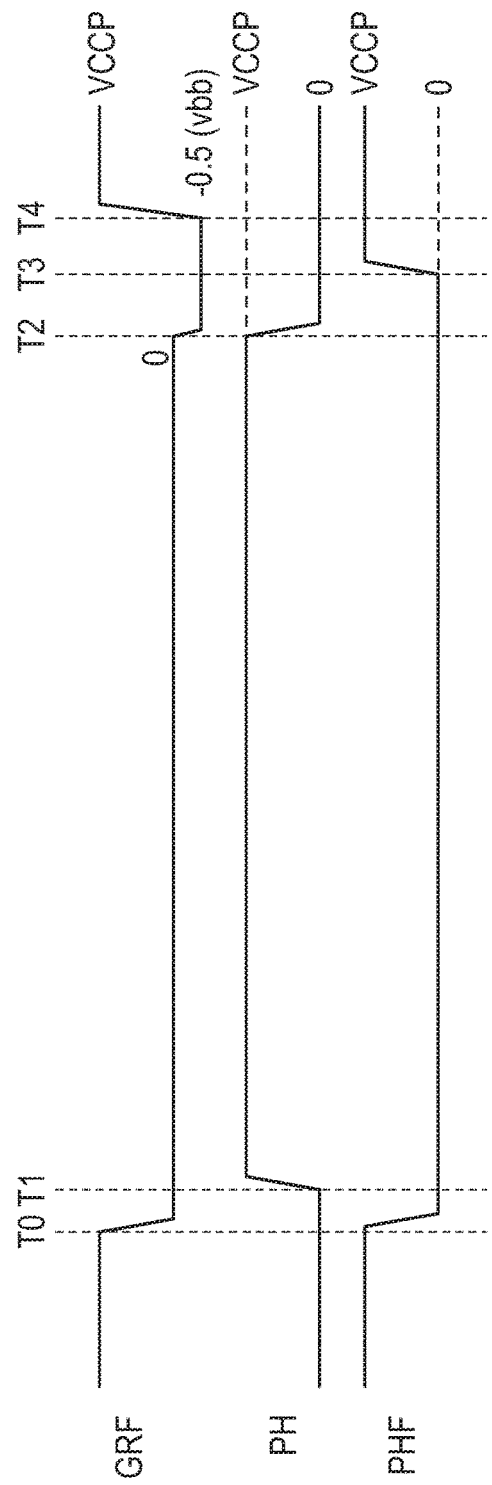
FIG. 4B is a timing diagram of input signals during operation of the word line driver of FIG. 3 in accordance with an embodiment of the present disclosure.

FIG. 4B is a timing diagram of input signals during operation of the word line driver of FIG. 3 in accordance with an embodiment of the present disclosure. Before a time T0, the signals GRF, PH and PHF may be set respectively to the inactive level (e.g., the logic high level at the voltage VCCP), the inactive level (e.g., the logic low level) and the active level (e.g., the logic high level at the voltage VCCP), the transistors 301, 302 and 303 may be rendered non-conductive, conductive and conductive, respectively.

At the time T0, the GRF signal may be set to the active state (e.g., the logic low level) to turn the transistors 301 and 302 ON (conductive) and OFF (non-conductive), respectively, and the PHF signal may be set to the inactive state (e.g., the logic low level) to turn the transistor 303 OFF. The PH signal may be set to the active state (e.g., the logic high level at the voltage VCCP) at a time T1 to drive the word line WL from the logic low level toward the logic high level at the voltage VCCP. At a time T2, the PH signal may be set to an inactive state (e.g., a logic low level), in order to discharge the node coupled to the word line WL toward to the logic low level. Furthermore, the GRF signal may be set to a state having a voltage Vbb (e.g., −0.5V), lower than the active state (e.g., 0V), at the time T2. Thus, the transistor 301 may be kept conductive even when the PH signal reaches the inactive low level. A voltage of the node 305 coupled to the word line WL becomes lower responsive to the lower voltage Vbb at the gate of the transistor 301, as compared to FIG. 4A. Thus, the drain-source voltage Vds of the transistor 302 may become lower while the transistor 302 may still be turned off, due to the lower voltage of the node 305 coupled to the word line WL. At a time T3, slightly later than T2, the PHF signal may be set to the active state (e.g., the logic high level at a voltage VCCP), that may turn on the transistor 303 and may couple the word line WL to the node 306 coupled to the VNEGWL voltage. At a time T4, slightly later than T3, the GRF signal may be set to an inactive state (e.g., a logic high level at a voltage VCCP) to turn on the transistor 302. For example, the transition of the word line WL to the inactive state for the "Conventional timing control" occurs earlier than the transition of the word line WL for "Example 1" as shown in FIG. 5.

Figure 6:
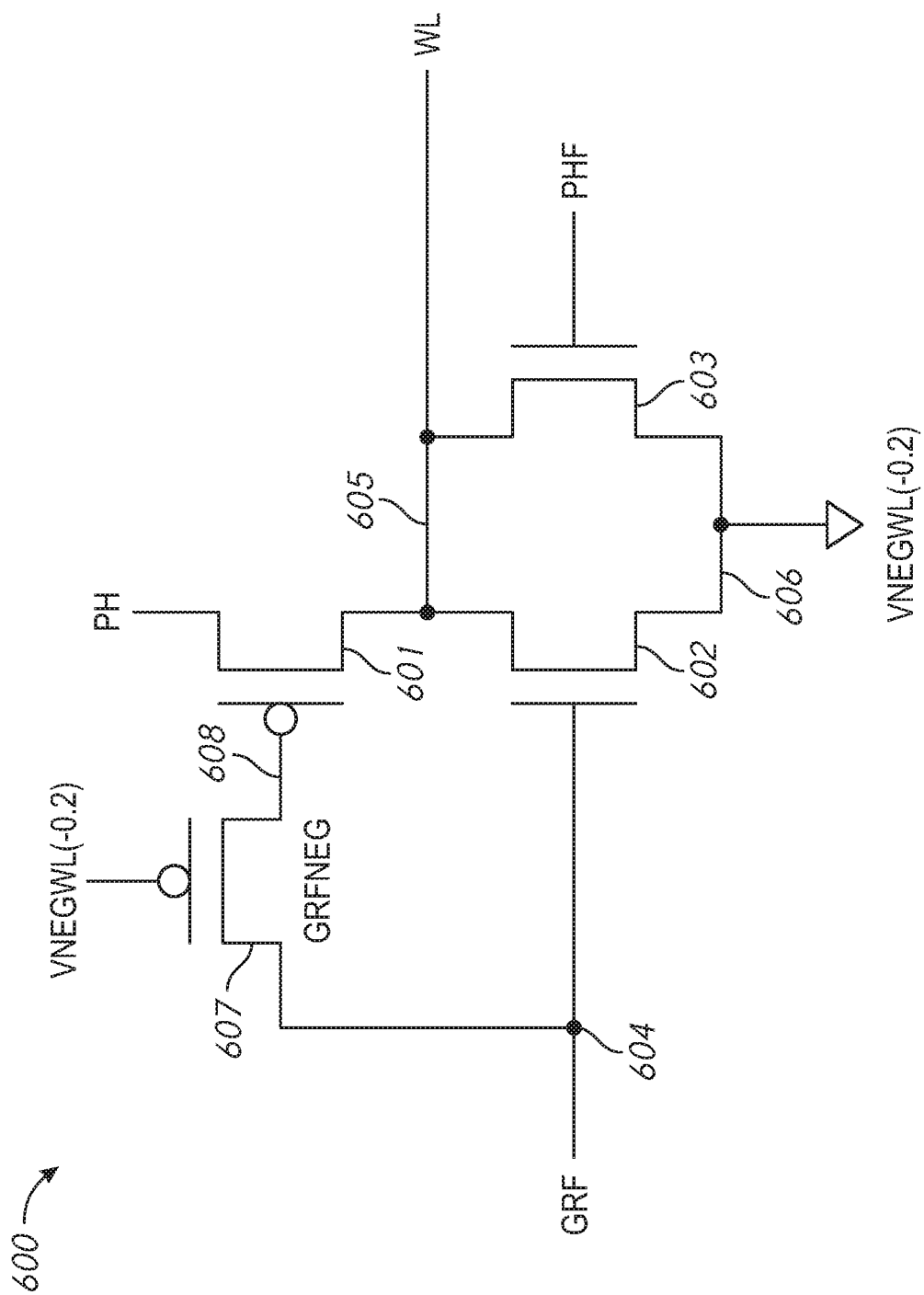
FIG. 6 is a schematic diagram of a word line driver in accordance with an embodiment of the present disclosure.

FIG. 6 is a schematic diagram of a word line driver 600 in accordance with an embodiment of the present disclosure. For example, the word line driver 600 may be used as the word line driver 220 in FIG. 2. The word line driver 600 may include a transistor 601 of a first type (e.g., p-channel) and a transistor 602 of a second type (e.g., n-channel). The transistors 601 and 602 may be coupled at their respective drains on a node 605 to form an output stage that is coupled to a respective word line WL. A gate of the transistor 601 may be coupled to a node 608. A gate of the transistor 602 may receive a GRF signal on a node 604. Another transistor 607 of the first type may be coupled between the nodes 604 and 608. A gate of the transistor 607 may receive a deactivated word line voltage VNEGWL. A source of the transistor 601 may receive a respective phase signal PH from the phase decoder 230 in FIG. 2, and a source of the transistor 602 may receive the deactivated word line voltage VNEGWL at a node 606 where a word line WL may be deactivated by coupling it to the VNEGWL voltage. The word line driver 600 may further include a transistor 603. For example, the transistor 603 may be of the second type (e.g., n-channel). A drain of the transistor 603 may be coupled to the node 605 and a source of the transistor 603 may be coupled to the node 606. A gate of the transistor 603 may receive a PHF signal.

Figure 7A:
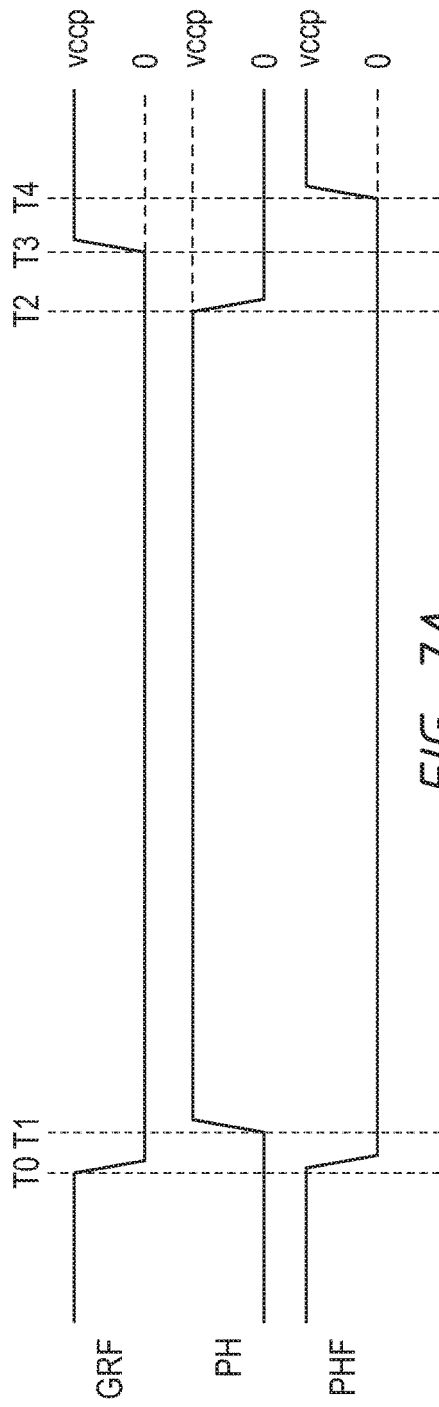
FIG. 7A is a timing diagram of input signals according to the prior art.

FIG. 7A is the timing diagram of input signals during operation of the word line driver of FIG. 3 previously shown as FIG. 4A for reference. The transistor 602 of the second type may deteriorate due to aging stress, including a high drain-source voltage Vds of the transistor 602 when the word line WL is discharged. A signal level of the word line WL may not transition to a logic low level merely receiving the PH signal in the inactive state at T3 and receiving the GRF signal in the inactive state at T4 as shown in FIG. 7A. As earlier shown in FIG. 5, The transition of the word line WL to the inactive state may be delayed due to the change in the threshold voltage after years of stress (e.g., Conventional scheme with 10 years stress).

Figure 7B:
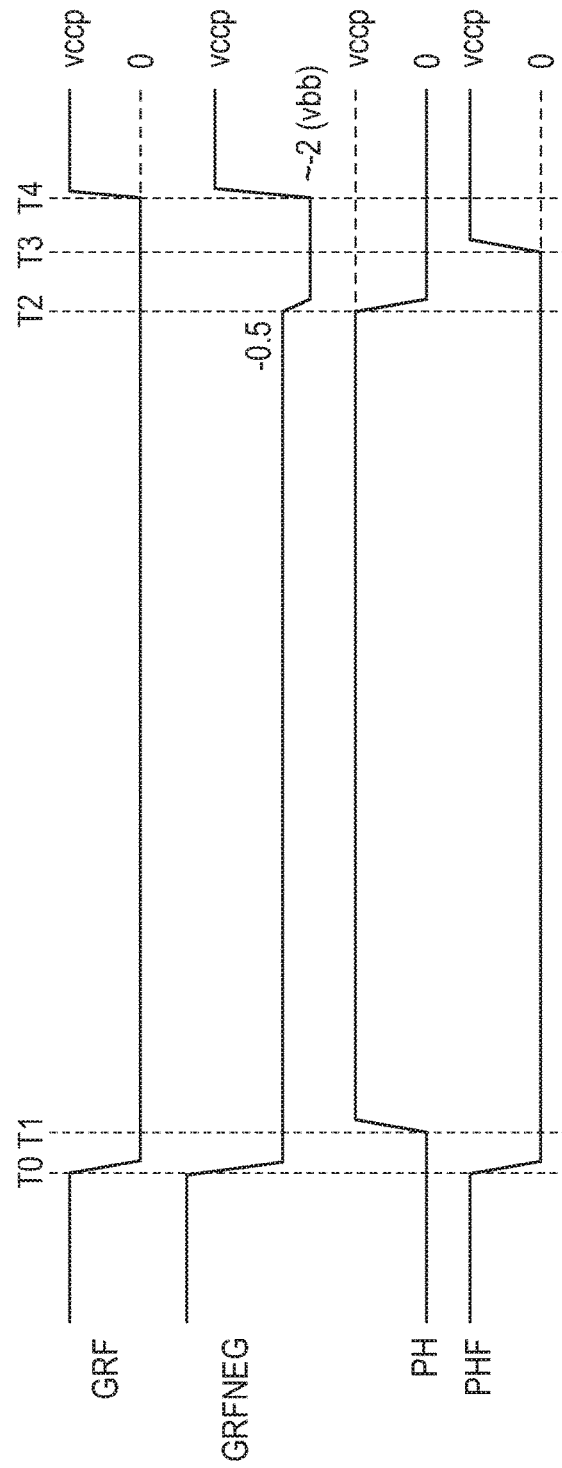
FIG. 7B is a timing diagram of input signals during operation of the word line driver of FIG. 6 in accordance with an embodiment of the present disclosure.

FIG. 7B is a timing diagram of input signals during operation of the word line driver of FIG. 6 in accordance with an embodiment of the present disclosure. Before a time T0, the signals GRF, PH and PHF may be set to the logic high level, the logic low level and the logic high level, respectively. As a gate of the transistor 607 may be supplied with the VNEGWL level (−0.2V, for example), the transistor 607 may be in a conductive state that may set a GRFNEG signal at the node 608 to the logic high level. Thus, the transistors 301, 302 and 303 may be rendered non-conductive, conductive and conductive, respectively.

At the time T0, the GRF signal may be set to the active state (e.g., the logic low level). This active low level may set the GRFNEG signal at the node 608 to a level (for example, −0.5V) that is lower than the ground level via the transistor 607. Further, the PHF signal may be set to the inactive state (e.g., the logic low level) at around the time T0. Thus, the transistors 601 and 602 may be turned ON and OFF, respectively, and the transistor 603 may be turned OFF. The PH signal may be set to the active state (e.g., the logic high level at the voltage VCCP) at a time T1 to drive the node 605 coupled to the word line WL from the logic low level toward the logic high level at VCCP voltage. At a time T2, the PH signal may be set to an inactive state (e.g., a logic low level). The transistor 607 coupled between the node 604 and the node 608 may receive the VNEGWL at a gate and may further lower, by its self-boosting operation, a voltage of the GRFNEG signal on the node 608 to a negative voltage (about −0.2V, for example) that is lower than the GRF signal on the node 604 as the PH signal changes from the active state to the inactive state (e.g., the logic low level). Thus, a voltage of the node 605 coupled to the word line WL becomes lower responsive to the negative voltage of the GRFNEG signal on the node 608 coupled to a gate of the transistor 601, and a drain-source voltage Vds of the transistor 602 may be lowered after the transition of a signal level of the PH signal from the active state to the inactive state, while the transistor 602 may still be turned off, due to the lower signal level of the word line WL. At a time T3, slightly later than T2, the PHF signal may be set to the active state (e.g., the logic high level at a voltage VCCP), that may turn on the transistor 603 and may couple the node 605, which is coupled to the word line WL, to the node 606 coupled to the VNEGWL voltage. Thus, the word line WL may be set to the inactive state through the transistor 603, responsive to the active transistor 601, the PH signal in the inactive state and the inactive transistor 602 due to the inactive GRE signal at the time T3 as shown in FIG. 7B in contrast to FIG. 7A. At a time T4, slightly later than T3, the GRF signal may be set to an active state (e.g., a logic high level at a voltage VCCP) and the GRF signal may turn the transistors 601 and 602 OFF and ON, respectively. For example, the transition of the word line WL to the inactive state for "Example 2" may occur earlier than the transition of the word line WL for "Example 1" as shown in FIG. 5. Since deterioration of a level of the GRFNEG by aging stress may be insignificant and the negative GRFNEG signal as shown in FIG. 7B may be able to provide a negative boost e.g., lowering the voltage of the word line WL) at the time T2 rather than the transistor 602 responsive to the GRF signal at the time T3 as shown in FIG. 7A. Thus, the transistor 602 may have a lower drain-source voltage Vds before being activation. As described the above, the transistor 607 may lower the voltage of the GRFNEG signal on the node 608 at the gate of the transistor 601 while the PH signal is in the inactive state after T2 and may further lower the drain-source voltage Vds of the transistor 602. For example, the lower drain-source voltage Vds of the transistor 602 may prevent hot carrier degradation.

Logic levels of signals used in the embodiments described the above are merely examples. However, in other embodiments, combinations of the logic levels of signals other than those specifically described in the present disclosure may be used without departing from the scope of the present disclosure.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. A method, comprising:
   driving a word line by a first transistor configured to be activated to couple a phase line to the word line;
   coupling the phase line to the word line by lowering a gate voltage of the first transistor;
   lowering a voltage of the phase line;
   continuing to couple the phase line to the word line by further lowering the gate voltage of the first transistor; and
   coupling the word line to an inactive level by raising a gate voltage of a second transistor after lowering the voltage of the phase line, the second transistor configured to be activated to couple the word line to the inactive level.

2. The method of claim 1, further comprising, after the word line is coupled to the inactive level, decoupling the phase line from the word line by raising the gate voltage of the first transistor.

3. The method of claim 1, wherein the first transistor is rendered non-conductive after the second transistor is rendered conductive.

4. The method of claim 1, wherein the first transistor is a first type, and the second transistor is a second type different from the first type.

5. The method of claim 4, wherein the phase line is decoupled from the word line by raising the gate voltage of the first transistor after the word line is coupled to the inactive level.

6. The method of claim 4, wherein the phase line is decoupled from the word line by raising the gate voltage of the first transistor after the gate voltage of the second transistor is raised.

7. The method of claim 1, further comprising:
when the phase line is coupled to the word line by lowering the gate voltage of the first transistor, lowering the gate voltage of the second transistor; and
after coupling the word line to the inactive level by raising the gate voltage of the second transistor, raising the gate voltage of the first transistor.

8. The method of claim 1, wherein the second transistor is rendered non-conductive when the phase line is coupled to the word line by the lowering of the gate voltage of the first transistor.

9. The method of claim 1, wherein coupling the phase line to the word line further includes lowering the gate voltage of the second transistor to a zero voltage, and
wherein keeping the phase line coupled to the word line further includes lowering the gate voltage of the first transistor to a negative voltage.

10. The method of claim 9, wherein the first transistor is a p-channel field effect transistor (pFET) and the second transistor is an n-channel field effect transistor (nFET).

11. An apparatus comprising a word line, comprising:
a first transistor configured to be activated to couple a phase line to the word line; and
a second transistor configured to be activated to couple the word line to an inactive level,
wherein the word line is coupled to the phase line when a gate voltage of the first transistor is lowered, and wherein the word line is coupled to the inactive level when a gate voltage of the second transistor is raised after a voltage of the phase line is lowered, and the word line is kept coupled to the phase line when the gate voltage of the first transistor is further lowered.

12. The apparatus of claim 11, wherein the word line is coupled to the inactive level when a gate voltage of the second transistor is raised, and after the gate voltage of the first transistor is further lowered.

13. The apparatus of claim 11, wherein the first transistor is rendered non-conductive after the second transistor is rendered conductive.

14. The apparatus of claim 11, wherein the second transistor is further configured to be activated to couple the word line to the inactive level after the gate voltage of the first transistor is further lowered, and then the first transistor is further configured to be rendered non-conductive when the gate voltage of the first transistor is raised.

15. The apparatus of claim 11, wherein the word line is coupled to the phase line when the gate voltage of the first transistor is lowered to a zero voltage, and the word line is kept coupled to the phase line when the gate voltage of the first transistor is further lowered to a negative voltage.

16. The apparatus of claim 11, wherein the second transistor is included in a pair of transistors configured to be activated to couple the word line to the inactive level,
wherein the first transistor is a p-channel field effect transistor (pFET), and
wherein each transistor of the pair of other transistors is an n-channel field effect transistor (nFET).

17. An apparatus, comprising:
a driver including a transistor coupled to a phase line, and further including a pair of transistors coupled to an inactive level,
wherein the transistor is configured to be activated to couple a word line to the phase line when a gate voltage of the transistor is lowered, and the word line is continued to be coupled to the phase line when the gate voltage of the transistor is further lowered and a voltage of the phase line is lowered, and
wherein one transistor of the pair of transistors is configured to be activated to couple the word line to the inactive level when a gate voltage of the one transistor is raised after the voltage of the phase line is lowered.

18. The apparatus of claim 17, wherein after the gate voltage of the transistor is further lowered, the one transistor of the pair of transistors is activated, and the transistor is rendered non-conductive thereafter.

19. The apparatus of claim 17, wherein after the word line is coupled to the inactive level by the one transistor of the pair of transistors, the transistor is rendered non-conductive when the gate voltage of the transistor is raised.

20. The apparatus of claim 17, wherein after the one transistor of the pair of transistors is rendered conductive, the transistor is rendered non-conductive and another transistor of the pair of transistors is rendered conductive.

* * * * *